United States Patent
Anai et al.

(10) Patent No.: US 12,070,801 B2
(45) Date of Patent: Aug. 27, 2024

(54) BONDING MATERIAL AND BONDED STRUCTURE

(71) Applicant: Mitsui Mining & Smelting Co., Ltd., Tokyo (JP)

(72) Inventors: Kei Anai, Ageo (JP); Jung-Lae Jo, Ageo (JP)

(73) Assignee: Mitsui Mining & Smelting Co., Ltd. (JP)

( * ) Notice: Subject to any disclaimer, the term of this patent is extended or adjusted under 35 U.S.C. 154(b) by 190 days.

(21) Appl. No.: 17/435,846

(22) PCT Filed: Mar. 2, 2020

(86) PCT No.: PCT/JP2020/008654
§ 371 (c)(1),
(2) Date: Sep. 2, 2021

(87) PCT Pub. No.: WO2020/202971
PCT Pub. Date: Oct. 8, 2020

(65) Prior Publication Data
US 2022/0157765 A1   May 19, 2022

(30) Foreign Application Priority Data
Mar. 29, 2019   (JP) ................................ 2019-068289

(51) Int. Cl.
*B22F 7/08*     (2006.01)
*B22F 1/052*    (2022.01)
(Continued)

(52) U.S. Cl.
CPC ............... *B22F 7/08* (2013.01); *B22F 1/052* (2022.01); *B22F 1/054* (2022.01); *B22F 1/0551* (2022.01);
(Continued)

(58) Field of Classification Search
None
See application file for complete search history.

(56) References Cited

U.S. PATENT DOCUMENTS

2006/0105193 A1*  5/2006  Burger .................. B23K 35/00
                                                      428/654
2014/0225247 A1   8/2014  Becker et al.
(Continued)

FOREIGN PATENT DOCUMENTS

EP        3834965 A1     6/2021
JP        2011-219862 A  11/2011
(Continued)

OTHER PUBLICATIONS

Heraeus Electronics "Die Top System", [online] [retrieved on Mar. 29, 2019], Retrieved from the Internet: <https://www.heraeus.com/en/het/products_and_solutions_het/material_systems/die_top_system/dts_page.aspx> (3 pages).
(Continued)

*Primary Examiner* — Xiaobei Wang
(74) *Attorney, Agent, or Firm* — Harness, Dickey & Pierce, P.L.C.

(57) ABSTRACT

A bonding material includes: a copper foil; and a sinterable bonding film formed on one surface of the copper foil. The bonding film contains a copper powder and a solid reducing agent. The bonding material is used for bonding to a bonding target having, on its surface, at least one metal selected from the group consisting of gold, silver, copper, nickel, and aluminum. The bonding material is also used as a material for wire bonding. A bonded structure is also provided in which a bonding target having a metal layer formed on its surface and a copper foil are electrically connected to each other via a bonding layer formed of a sintered structure of a copper powder, wherein the metal layer contains at least one
(Continued)

metal selected from the group consisting of gold, silver, copper, nickel, and aluminum.

12 Claims, 2 Drawing Sheets

(51) Int. Cl.
| | | |
|---|---|---|
| *B22F 1/054* | (2022.01) | |
| *B22F 1/068* | (2022.01) | |
| *B22F 1/107* | (2022.01) | |
| *B22F 1/145* | (2022.01) | |
| *B23K 35/02* | (2006.01) | |
| *B23K 35/30* | (2006.01) | |
| *B32B 15/01* | (2006.01) | |
| *H01L 23/00* | (2006.01) | |

(52) U.S. Cl.
CPC .............. *B22F 1/056* (2022.01); *B22F 1/068* (2022.01); *B22F 1/107* (2022.01); *B22F 1/147* (2022.01); *B23K 35/0238* (2013.01); *B23K 35/302* (2013.01); *B32B 15/01* (2013.01); *H01L 24/29* (2013.01); *H01L 24/45* (2013.01); *B22F 2301/10* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/45147* (2013.01)

(56) References Cited

U.S. PATENT DOCUMENTS

| | | |
|---|---|---|
| 2016/0240505 A1 | 8/2016 | Tatsumi et al. |
| 2017/0043404 A1* | 2/2017 | Fukumoto ............... B22F 1/102 |
| 2017/0294396 A1 | 10/2017 | Inoue et al. |
| 2018/0269074 A1 | 9/2018 | Kamikoriyama et al. |
| 2019/0148331 A1 | 5/2019 | Honda et al. |
| 2021/0138541 A1* | 5/2021 | Anai ....................... H01B 1/22 |

FOREIGN PATENT DOCUMENTS

| | | | |
|---|---|---|---|
| JP | 2013196936 A | * | 9/2013 |
| JP | 2013-209720 A | | 10/2013 |
| JP | 2015-076232 A | | 4/2015 |
| JP | 2015-90900 A | | 5/2015 |
| JP | 2016-011448 A | | 1/2016 |
| JP | 2017-201694 A | | 11/2017 |
| JP | 2018-501657 A | | 1/2018 |
| WO | 2015-068853 A1 | | 5/2015 |
| WO | 2017-221613 A1 | | 12/2017 |
| WO | WO-2020032161 A1 * | 2/2020 | ............ B22F 1/0059 |

OTHER PUBLICATIONS

International Search Report (English and Japanese) of the International Searching Authority issued in PCT/JP2020/008654, mailed Jun. 2, 2020; ISA/JP (5 pages).

* cited by examiner

BONDING MATERIAL AND BONDED STRUCTURE

CROSS REFERENCE TO RELATED APPLICATIONS

This application is a U.S. National Phase Application under 35 U.S.C. 371 of International Application No. PCT/JP2020/008654, filed on Mar. 2, 2020, which claims priority to Japanese Patent Application No. 2019-068289, filed on Mar. 29, 2019. The entire disclosures of the above applications are expressly incorporated by reference herein.

BACKGROUND

Technical Field

The present invention relates to a bonding material and a bonded structure.

Related Art

With the recent global trend for energy efficiency and conservation, semiconductor devices called power devices have been widely used as power conversion/control devices such as inverters. In order to improve the efficiency and compactness of semiconductor devices, an electronic component called a power module is used in which a plurality of semiconductor devices are mounted on a metal-ceramic substrate and metal layers and metal wires are arranged on upper surfaces of the semiconductor devices.

In recent years, in order to increase the power of power modules and improve the reliability thereof, studies have been made to switch over from aluminum wires, which are common metal wires used in power modules, to copper wires. However, in the case where copper wires are to be bonded directly to semiconductor chips, special production apparatuses and production conditions are further required, and the risk of damages to the semiconductor chips caused by thermomechanical stress applied thereto during bonding of the semiconductor chips increases. Therefore, the switchover to copper wires is not easy.

To address the above-described problems, sintered materials formed by sintering a metal, such as silver or copper, have garnered attention.

US 2014/225247A1 discloses a method for forming a connection between a power semiconductor chip and a thick wire. In US 2014/225247A1, a description is also given to the effect that, after a patterned metal molded body is fitted on a semiconductor via an Ag layer formed by means of low-temperature sintering, a thick wire is bonded to an upper side of the molded body.

Heraeus Electronics "Die Top System", [online] [retrieved on 2019 Mar. 29], Retrieved from the Internet: https://www.heraeus.com/en/het/products_and_solutions_het/material_systems/die_top_system/dts_page.aspx discloses a bonding material used for bonding to a semiconductor device, the bonding material including a copper foil and a silver-containing bonding paste applied to one surface of the copper foil. "Die Top System" also discloses a power module in which a semiconductor device and the copper foil are electrically connected to each other via a bonding portion containing silver by sintering the above-described bonding material, which contains silver.

However, with the connection forming method disclosed in US 2014/225247A1, the production process is complicated because of the necessity of forming a circuit by preliminarily performing lithography, etching, or the like on the molded body fixed on a carrying foil via a joining layer, and as a result, the production cost is high.

The bonding material disclosed in "Die Top System" uses an expensive metal material, such as silver, which results in a high production cost. In addition, in the case where the bonding material disclosed in "Die Top System" is used in a power module, an additional step of forming a metal layer containing silver or gold on a surface of the copper foil that faces the semiconductor device needs to be performed in order to increase the bonding strength, and this also increases the production cost.

Therefore, an object of the present invention is to provide a bonding material and a bonded structure that realize both high bonding strength and a reduced production cost.

SUMMARY

The present invention provides a bonding material including: a copper foil; and a sinterable bonding film formed on one surface of the copper foil, wherein the bonding film contains a copper powder and a solid reducing agent, and the bonding material is used for bonding to a bonding target having, on its surface, at least one metal selected from the group consisting of gold, silver, copper, nickel, and aluminum.

Also, the present invention provides a bonding material that is used to form a wire bonding structure, the bonding material including a copper foil and a sinterable bonding film formed on one surface of the copper foil, wherein the bonding film contains a copper powder and a solid reducing agent.

Furthermore, the present invention provides a bonded structure in which a bonding target having, on its surface, at least one metal selected from the group consisting of gold, silver, copper, nickel, and aluminum and a copper foil are electrically connected to each other via a bonding layer formed of a sintered structure of a copper powder, wherein a structure (3) below is formed in the bonding layer:

[Chem. 1]

(3)

where $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group, and * represents a copper-binding site.

DETAILED DESCRIPTION

Figure 1A:
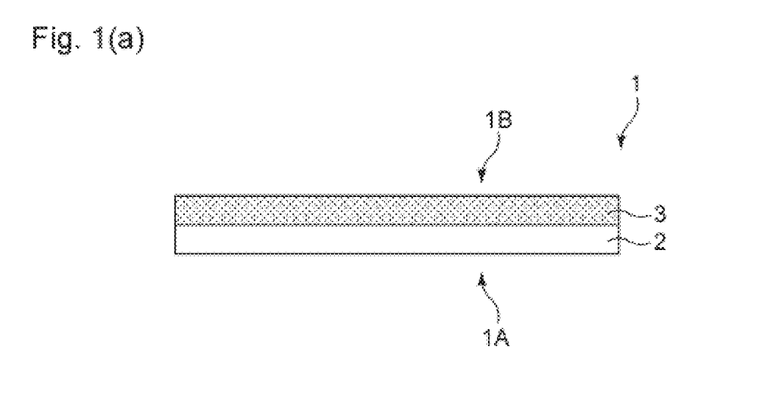
FIG. 1(a) is a schematic side view showing an embodiment of a bonding material.

Hereinafter, a bonding material and a bonded structure of the present invention will be described based on preferred embodiments thereof. As shown in FIG. 1(a), a bonding material 1 includes a copper foil 2 and a bonding film 3 formed on one surface of the bonding film 3. The bonding film 3 contains a copper powder and a solid reducing agent.

The bonding material 1 is favorably used in bonding to a bonding target having, on its surface, at least one metal selected from the group consisting of gold, silver, copper, nickel, and aluminum, because it can realize high bonding strength at low cost. The metal that is present on the surface of the bonding target may be in the form of a metal layer that is a layer formed on the surface of the bonding target.

Also, the bonding material 1 is favorably used as a bonding base material for forming a wire bonding structure. Examples of the bonding target include metals such as copper and silver, semiconductor devices, and ceramics.

Figure 1B:
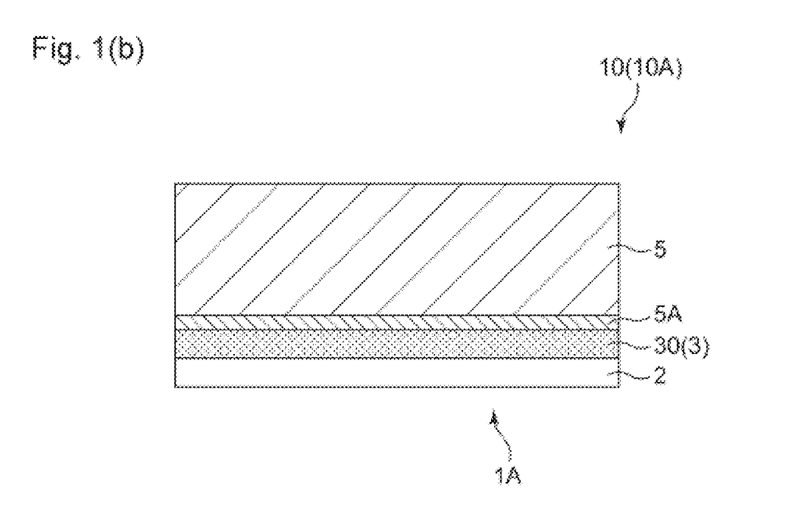
FIG. 1(b) is a schematic side view showing an embodiment of a bonded structure.

More specifically, the bonding film 3 has a sinterable structure. The copper foil 2 of the bonding material 1 and a bonding target 5 can be bonded together by firing the bonding film 3 of the bonding material 1 and the bonding target preferably under pressure. As shown in FIG. 1(b), the fired bonding film 3 serves as a conductive bonding layer 30 formed of a sintered structure of the copper powder. The bonding layer 30 bonds and also electrically connects the copper foil 2 to the bonding target 5 that has a metal layer 5A formed on a surface thereof. The bonding material 1 can be obtained using, for example, a production method that will be described later. Note that the term "sinterable" means that metal particles constituting the copper powder are present in an unfused state in the bonding film, and a sintered body formed of a sintered structure of fused metal particles can be formed by sintering the metal particles in the bonding film.

The copper foil 2 constituting the bonding material 1 is favorably used as a connection portion of a bonding wire in a power module, for example. From the viewpoint of ensuring both high strength of the copper foil itself and high electrical conductivity of the bonded structure, the copper foil preferably contains copper in an amount of 97 mass % or more, or more preferably 99 mass % or more, or even more preferably is made of copper and the balance consisting of unavoidable impurities. In addition, as long as the effects of the present invention are not impaired, at least one surface of the copper foil may be surface-treated with an organic compound, such as benzotriazole, for the purpose of corrosion protection and the like.

Also, from a similar viewpoint, the thickness of the copper foil is preferably from 0.5 μm to 1000 μm, and more preferably from 1 μm to 500 μm. The thickness of the copper foil can be measured by, for example, observing a cross section of the bonding material in a thickness direction using a scanning electron microscope.

As shown in FIG. 1(a), the bonding film 3 of the bonding material 1 is preferably formed on only one surface of the copper foil 2. In addition, the bonding film 3 may be formed on the entire region of one surface of the copper foil 2, or may be discontinuously formed on one surface of the copper foil 2. In the case where the bonding film 3 is discontinuously formed on one surface of the copper foil 2, the copper foil 2 is exposed at portions where the bonding film 3 is not formed. Preferably, no layer is provided between the copper foil 2 and the bonding film 3. A preferred thickness of the bonding film 3 will be described in detail in relation to the production method, which will be described later.

As shown in FIG. 1(a), it is preferable that the bonding material 1 does not have other solid layers such as an additional copper foil and an additional bonding film on a surface 1A thereof on which the bonding film 3 is not formed. Similarly, it is also preferable that the bonding material 1 does not have other solid layers such as an additional copper foil and an additional bonding film on a surface 1B of the bonding film 3. However, as long as the effects of the present invention can be achieved, the bonding material 1 may have another solid layer on at least one of the surfaces thereof.

The copper powder contained in the bonding film 3 is an assemblage of metal particles containing copper. The copper powder may contain the metal particles in the form of, for example, (i) an assemblage of copper particles made only of copper and the balance consisting of unavoidable impurities; (ii) an assemblage of the above-described copper particles and other metal particles; (iii) an assemblage of copper alloy particles containing 50 mass % or more of copper and another metal; (iv) an assemblage of the above-described copper particles and the above-described copper alloy particles; or (v) an assemblage of the above-described copper particles, the above-described copper alloy particles, and other metal particles. In the following description, all of these forms will also be simply called "copper powder". In addition, depending on the context, the term "copper powder" may refer to metal particles constituting the copper powder, or the copper powder itself, which is an assemblage of metal particles containing copper.

From the viewpoint of realizing both a reduction in the production cost and an improvement in the electrical conductivity, the copper powder is constituted by copper particles made of copper and the balance consisting of unavoidable impurities, the copper particles containing copper in an amount of preferably 50 mass % or more, more preferably 70 mass % or more, and even more preferably 90% mass or more. Also, from a similar viewpoint, the copper powder preferably contains the particles in any of the forms of (i) an assemblage of copper particles made only of copper and the balance consisting of unavoidable impurities; (iii) an assemblage of copper alloy particles containing 50 mass % or more of copper and another metal; and (iv) an assemblage of the above-described copper particles and the above-described copper alloy particles, or more preferably in the form of (i) an assemblage of copper particles made only of copper and the balance consisting of unavoidable impurities. In the case where the copper powder contains a plurality of types of metal particles, the copper content in the copper powder is calculated with respect to all the types of metal particles constituting the copper powder.

The metal particles constituting the copper powder may have, for example, a spherical shape, a flat (flake-like) shape, a dendritic (branching tree-like) shape, a rod-like shape, or the like, and one of these shapes may be used alone, or a plurality of shapes of these shapes may be used in combination. The shape of the metal particles depends on the method for producing the metal particles. For example, spherical particles are likely to be obtained when a wet reduction process or an atomizing process is employed as the method for producing the metal particles. Dendritic or rod-shaped particles are likely to be obtained when an electrolytic reduction process is employed. Flat particles can be obtained by, for example, plastically deforming spherical particles by applying a mechanical external force thereto.

It is preferable that the copper powder contains spherical metal particles containing copper. In this case, the particle size of the spherical metal particles can be measured by performing image analysis on a scanning electron microscope image. Specifically, with the user of Mac-View manufactured by Mountech Co., Ltd., image data of the metal particles is loaded, then, fifty or more metal particles in the data are randomly chosen, and the particle size (Heywood diameter) of each particle, the area S of a 2D projection of each particle, and the peripheral length L of the 2D projection of each particle are measured. Subsequently, based on the obtained Heywood diameter, the volume of each particle is calculated assuming that the particle is a perfect sphere, and, regarding the thus calculated volumes, the volume-based cumulative particle size at a cumulative volume of 50 vol % is obtained and used as $D_{SEM50}$.

Whether or not metal particles are spherical is judged by calculating the circularity coefficient $4\pi S/L^2$ from the area S and the peripheral length L of each of the particles randomly chosen in the above-described method, and further calculating the arithmetic mean value of the calculated circularity coefficients. If the arithmetic mean value of the circularity coefficients is 0.85 or more, or preferably 0.90 or more, the metal particles are defined as being spherical.

The particle size of the spherical metal particles, in terms of the above-described volume-based cumulative particle size $D_{SEM50}$ at a cumulative volume of 50 vol %, is preferably from 30 nm to 200 nm, and more preferably from 40 nm to 180 nm. With this configuration, a dense sintered structure can be formed when bonding the copper foil and the bonding target together, and consequently, a bonded structure using the bonding material can realize both good heat resistance and high bonding strength. In addition, since a dense sintered structure can be formed even under sintering conditions at a relatively low temperature, excessive heat load on the bonding target during the production can be prevented, and a bonded structure that can realize desired performance can thus be obtained.

$D_{SEM50}$ is obtained by randomly choosing fifty or more particles from a scanning electron microscope image of metal particles to be measured, measuring the particle size (Heywood diameter) of each of the particles, and subsequently calculating, based on the obtained particle sizes, the volumes of the particles assuming that the particles are perfect spheres.

It is also preferable that the copper powder contains flat metal particles containing copper. In this case, the volume-based cumulative particle size $D_{50}$ at a cumulative volume of 50 vol % as measured through particle size distribution analysis using a laser diffraction and scattering method, of the flat metal particles is preferably 0.3 µm or more, more preferably 0.5 µm or more, and even more preferably 0.7 µm or more. Also, $D_{50}$ is preferably 100 µm or less, more preferably 70 µm or less, and even more preferably 50 µm or less. With the copper powder containing particles having such a particle size, a bonded structure using the bonding material can realize both good heat resistance and high bonding strength. In addition, a dense sintered structure can be formed even under sintering conditions at a relatively low temperature. A flat shape refers to a shape having a pair of plate surfaces that form the main surfaces of a particle and a side surface that intersects the plate surfaces, and the plate surfaces and the side surface may each independently be a flat surface, a curved surface, or an uneven surface.

In the case where the metal powder contains flat metal particles, the ratio of the length of the major axis to the length of the minor axis (hereinafter this ratio is also referred to as "aspect ratio") of the plate surfaces of the metal particles is preferably 2 or more, and more preferably 5 or more. Also, the aspect ratio is preferably 80 or less, and more preferably 40 or less. With the copper powder further containing particles having such a shape, a densely sintered coating film can be formed, and thus, high bonding strength between conductors and an improvement in the electrical conduction reliability can be realized.

The lengths of the major axis and the minor axis of the flat metal particles are obtained in the following manner. More specifically, while a particle to be measured is rotated 360 degrees in a direction parallel to its plate surface, imaginary circumscribed rectangles of 2D projections of the particle are examined, and the long side of a circumscribed rectangle that has a side with the longest length of all the circumscribed rectangles is used as the major axis. On the other hand, while the particle to be measured is rotated 360 degrees in a direction perpendicular to its plate surface, imaginary circumscribed rectangles of 2D projections of the particle are examined, and the short side of a circumscribed rectangle that has a side with the longest length of all the circumscribed rectangles as its long side is used as the minor axis. Similarly, the major axis and the minor axis of each of fifty or more randomly chosen particles are measured, and arithmetic mean values of the measured lengths are obtained as the lengths of the major axis and the minor axis of the flat metal particles.

To measure $D_{50}$, for example, 0.1 g of a specimen to be measured is mixed with 50 mL of an aqueous solution of a dispersant and dispersed for one minute using an ultrasonic homogenizer (US-300T manufactured by Nihonseiki Kaisha Ltd.). After that, the particle size distribution is measured using a laser diffraction and scattering particle size distribution analyzer, for example, MT3300 EXII manufactured by MicrotracBEL Corp.

The solid reducing agent contained in the bonding film 3 is solid at room temperature (25° C.) and is used to promote sintering of the copper powder during the firing of the bonding film. For this purpose, it is advantageous that the solid reducing agent is a solid reducing agent with a chemical structure having at least one amino group and a plurality of hydroxyl groups. The use of a reducing agent with such a structure makes it possible to reduce oxidation of the copper powder during the sintering, when compared with a reducing agent that has a plurality of hydroxyl groups and does not contain an amino group, and a dense sintered structure can be obtained due to the sintering of the copper powder being promoted. Therefore, even when the reducing agent content is low, a bonded structure having a bonding layer with high bonding strength can be obtained. The wording "is solid at room temperature (25° C.)" means that the melting point of the solid reducing agent is higher than 25° C.

It is preferable that the melting point of the solid reducing agent is equal to or lower than the sintering temperature of the copper powder. It is also preferable that the boiling point of the solid reducing agent is higher than the boiling point of a liquid medium, which will be described later. When a solid reducing agent having such material properties is used, the solid reducing agent remains as a solid in the bonding film and can thus improve the shape retention of the bonding film. As a result, during the firing of the bonding film, even when a pressure is applied to the bonding film, the bonding film is unlikely to protrude from between the bonding target and the copper foil, and therefore, the control of the thickness is facilitated even more. Thus, a bonded structure with high bonding strength can be obtained. Furthermore, during the firing of the bonding film, the reducing agent melts and spreads uniformly throughout the bonding film, and therefore, the sintering of the copper powder is uniformly promoted. Thus, a highly heat-resistant bonded structure with an even denser sintered structure can be obtained.

With this bonding material, since the bonding film contains the solid reducing agent, the metal particles constituting the copper powder are sufficiently sintered during the sintering with the bonding target, and a dense sintered structure is thus formed. As a result, high bonding strength between the copper foil of the bonding material and the bonding target is obtained. Also, since both the bonding film and the copper foil contain copper, in the production process of a power module, bonding can be achieved without performing an additional surface treatment step, such as metallization, for increasing the bonding strength. As a result, the production cost can be reduced while realizing high bonding strength. Also, since the raw materials constituting the bonding film are relatively inexpensive, there is an advantage that the production cost can be reduced even further.

From the viewpoint of realizing both high bonding strength during the bonding and high electrical conduction reliability, it is preferable that an amino alcohol compound represented by the chemical formula (1) or (2) below is used as the solid reducing agent. The term "amino alcohol compound" refers to an organic compound having at least one amine selected from primary to tertiary amines and at least one alcohol selected from primary to tertiary alcohols in a single chemical structure.

[Chem. 2]

In the chemical formula (1) or (2), $R^1$ to $R^6$ each independently represent a hydrogen atom, a hydroxyl group, a hydrocarbon group having 1 to 10 carbon atoms, or a hydrocarbon group having 1 to 10 carbon atoms and having a hydroxyl group. The hydrocarbon group may be a saturated or unsaturated aliphatic group. This aliphatic group may be linear or branched. Examples of the hydrocarbon group for $R^1$ to $R^6$ include a methyl group, an ethyl group, and a propyl group.

In the formula (2), $R^7$ represents a hydrocarbon group having 1 to 10 carbon atoms or a hydrocarbon group having 1 to 10 carbon atoms and having a hydroxyl group. The hydrocarbon group may be a saturated or unsaturated aliphatic group. This aliphatic group may be linear or branched. Examples of the hydrocarbon group for $R^7$ include a methylene group, an ethylene group, a propylene group, and a butylene group.

In the chemical formula (1), at least two of $R^1$ to $R^5$ contain a hydroxyl group. That is to say, at least two of $R^1$ to $R^5$ are each a hydroxyl group or hydrocarbon group having 1 to 10 carbon atoms and having a hydroxyl group. Also, in the formula (2), at least two of $R^1$ to $R^6$ contain a hydroxyl group. That is to say, at least two of $R^1$ to $R^6$ are each a hydroxyl group or a hydrocarbon group having 1 to 10 carbon atoms and having a hydroxyl group. In particular, in the chemical formula (1), it is preferable that at least two of $R^1$ to $R^5$ are each a hydrocarbon group having 1 to 4 carbon atoms and having a hydroxyl group. Also, in the chemical formula (2), it is preferable that at least two of $R^1$ to $R^6$ are each a hydrocarbon group having 1 to 4 carbon atoms and having a hydroxyl group. In this case, it is preferable that the hydroxyl group in the hydroxyalkyl group is attached to the end of the alkyl group.

In the reducing agent represented by the chemical formula (1), from the viewpoint of improving the sinterability of the copper powder, it is preferable that at least three, more preferably at least four, or even more preferably all, of $R^1$ to $R^5$ contain a hydroxyl group. From a similar viewpoint, in the reducing agent represented by the chemical formula (2), it is preferable that at least three, or more preferably at least four, of $R^1$ to $R^6$ contain a hydroxyl group.

Specific examples of the amino alcohol compound represented by the chemical formula (1) or (2) include: bis(2-hydroxyethyl)iminotris(hydroxymethyl)methane (BIS-TRIS, melting point: 104° C., boiling point: above 300° C., corresponding to the chemical formula (1)); 2-amino-2-(hydroxymethyl)-1,3-propanediol (TRIS, melting point: 169 to 173° C., boiling point: above 300° C., corresponding to the chemical formula (1)); and 1,3-bis(tris(hydroxymethyl)methylamino)propane (BIS-TRIS propane, melting point: 164 to 165° C., boiling point: above 300° C., corresponding to the chemical formula (2)). Of these compounds, bis(2-hydroxyethyl)iminotris(hydroxymethyl)methane (BIS-TRIS) is preferably used as the solid reducing agent, from the viewpoint of improving the sinterability of the copper powder and obtaining a bonded structure that realizes high bonding strength between conductors.

One of the above-described solid reducing agents may be used alone, or two or more thereof may be used in combination. In each case, the ratio of the solid reducing agent in the bonding film is preferably 0.1 parts by mass or more, and more preferably 1 part by mass or more, with respect to 100 parts by mass of the copper powder, from the viewpoint of improving the sinterability of the copper powder. Also, from the viewpoint of realizing favorable application performance to the copper foil while maintaining the ratio of the copper powder in the bonding layer composition, the ratio of the solid reducing agent is practically 10 parts by mass or less, preferably 8 parts by mass or less, and even more preferably 5 parts by mass or less.

The bonding film may further contain a liquid medium having a boiling point of less than 300° C. The liquid medium is used to improve the formability of the bonding film during the formation of the bonding film. From this viewpoint, it is preferable that the above-described liquid medium is liquid at room temperature (25° C.).

In the case where the bonding film contains the liquid medium, it is also preferable that the liquid medium is a non-aqueous medium from the viewpoint of reducing oxidation of the metal particles constituting the copper powder.

It is preferable that the liquid medium is a monohydric or polyhydric alcohol, and more preferably a polyhydric alcohol, because such a liquid medium favorably improves the formability of the bonding film and also has appropriate volatility. Examples of the polyhydric alcohol include propylene glycol (boiling point: 188° C.), ethylene glycol (boiling point: 197° C.), hexylene glycol (boiling point: 197° C.), diethylene glycol (boiling point: 245° C.), 1,3-butanediol (boiling point: 207° C.), 1,4-butanediol (boiling point: 228° C.), dipropylene glycol (boiling point: 231° C.), tripropylene glycol (boiling point: 273° C.), glycerol (boiling point: 290° C.), Polyethylene glycol 200 (boiling point: 250° C.), and Polyethylene glycol 300 (boiling point: 250° C.). One type of liquid medium may be used alone, or two or more types may be used in combination. Among these, a liquid medium containing at least one of hexylene glycol and polyethylene glycol such as Polyethylene glycol 200 or Polyethylene glycol 300 is preferable because such a liquid medium can improve the shape retention of the bonding film and the dispersibility of the components in the bonding film, thereby enabling a uniform and dense sintered structure to be obtained.

In the case where the bonding film contains the liquid medium, the liquid medium content in the bonding film is preferably 9 parts by mass or less, and more preferably 7 parts by mass or less, with respect to 100 parts by mass of the copper powder, from the viewpoint of improving the shape retention of the bonding film. In the case where the bonding film is produced according to, for example, the production method that will be described later, except for the liquid medium, the amounts of constituent materials contained in a coating film are substantially equal to those in the bonding film, which is a dried coating film obtained by drying the coating film. For this reason, the content ratio of the liquid medium can be calculated by, for example, measuring a change in the mass of the coating film before and after the drying.

Next, a method for producing the above-described bonding material and a method for producing a bonded structure using the bonding material will be described. A method for producing the bonding material 1 includes an application step of applying a bonding layer composition to at least one surface of the copper foil 2, for example, to form a coating film and a dried coating film forming step of drying the coating film to form the bonding film 3 as a dried coating film, in this order.

First, the bonding layer composition containing a copper powder and a solid reducing agent is applied to at least one surface of the copper foil to form a coating film. There is no particular limitation on the means of application of the bonding layer composition, and a known application means can be used. For example, screen printing, dispense printing, rotogravure printing, offset printing, or the like can be used. From the viewpoint of efficiently performing the step of applying the bonding layer composition, it is preferable that the bonding layer composition is a paste- or ink-like composition that contains a liquid medium. The bonding layer composition can be obtained by mixing the above-described copper powder and the above-described solid reducing agent, and the above-described liquid medium as necessary.

From the viewpoint of obtaining a bonding film that has high shape retention and the viewpoint of forming a bonded structure that stably has high bonding strength, the thickness of the coating film to be formed is preferably 1 μm or more, and more preferably 5 μm or more, immediately after the application. Also, the thickness of the coating film to be formed is preferably 1000 μm or less, and more preferably 700 μm or less.

In the case where the bonding layer composition contains a liquid medium, the liquid medium content in the bonding layer composition is preferably 40 parts by mass or less, and more preferably 35 parts by mass or less, with respect to 100 parts by mass of the copper powder, from the viewpoint of imparting appropriate viscosity to the bonding layer composition and improving the shape retention of the coating film when the bonding layer composition is applied to the copper foil.

It is preferable that, when unheated, the bonding layer composition has a viscosity of 20 Pa·s to 200 Pa·s, and more preferably 25 Pa·s to 180 Pa·s, at a shear rate of 10 s$^{-1}$ and 25° C., from the viewpoint of improving the ease of application of the coating film to the copper foil and the shape retention of the coating film. The viscosity of the bonding layer composition can be measured with a rheometer (viscoelasticity measurement apparatus) using a sensor of a parallel-plate type.

The bonding layer composition may also contain other components as long as the effects of the present invention can be achieved. Examples of the other components include a binder component, a surface tension regulator, an antifoaming agent, and a viscosity modifier. With regard to the content ratio of the other components, it is preferable that the total amount of the other components is from 0.1 parts by mass to 10 parts by mass with respect to 100 parts by mass of the copper powder.

Next, the coating film formed on the surface of the copper foil is dried, to obtain the bonding material 1 including the bonding film 3 and the copper foil 2. In the present step, at least a portion of the liquid medium is removed from the coating film by drying the coating film, and the bonding film 3 in which the amount of liquid medium in the coating film has been reduced is thus formed on one surface of the copper foil. The shape retention of the bonding film can be improved even more by removing the liquid medium from the coating film. Furthermore, when the bonding material including the copper foil and the bonding film and the bonding target are bonded together, the adhesion of the bonding layer can be improved, and high bonding strength can thus be realized. As described above, in the bonding film, the ratio of the liquid medium is 9 mass % or less with respect to 100 parts by mass of the copper powder. In the present step, except for the liquid medium, the amounts of constituent materials contained in the coating film are substantially equal to those in the bonding film, which is a dried coating film obtained by drying the coating film. Moreover, in the bonding film formed in the present step, the metal particles constituting the copper powder in the bonding film are not fused to each other, and are sinterable.

In order to remove the liquid medium through drying, the liquid medium can be volatilized using a drying method such as natural drying using the volatility of the liquid medium, hot air drying, infrared irradiation, or hot plate drying. The present step can be modified as appropriate depending on the constituent components of the bonding layer composition, but it is preferable to perform the present step at a temperature lower than the melting point of the metal particles constituting the copper powder. For example, the present step can be performed in an air atmosphere at a temperature of 60° C. to 150° C. under atmospheric pressure for 1 to 30 minutes.

The thickness of the bonding film 3 is preferably 0.5 μm or more, and more preferably 3 μm or more, from the viewpoint of obtaining sufficient bonding strength. Also, the thickness of the bonding film 3 is preferably 980 μm or less, and more preferably 600 μm or less, from the viewpoint of improving the compactness of electronic components. The thickness of the bonding film 3 can be adjusted by, for example, appropriately adjusting the thickness of the coating film formed in the above-described step. The thickness of the bonding film 3 can be measured by, for example, observing a cross section of the bonding material in the thickness direction using a scanning electron microscope.

A bonded structure 10 having a structure shown in FIG. 1(b) can be obtained by bonding the bonding material 1 obtained through the foregoing steps and a bonding target 5 together. It is preferable that, in the bonded structure 10, the bonding target 5 having a metal layer 5A formed on a surface thereof, the metal layer 5A containing at least one metal selected from the group consisting of gold, silver, copper, nickel, and aluminum, is electrically connected to the copper foil 2 via the bonding layer 30 formed of a sintered structure of the copper powder.

First, after the bonding material 1 has been obtained through the above-described steps, the bonding film 3 of the bonding material 1 and the bonding target 5 are placed facing each other as shown in FIG. 1(b), to obtain a stack 10A in which the bonding film 3 is located between the bonding target 5 and the copper foil 2 of the bonding material 1. More specifically, a surface 1B of the bonding film 3 of the bonding material 1 and a surface of the metal layer 5A formed on the surface of the bonding target 5 are brought into areal contact with each other, to obtain the stack 10A. In a state in which the stack 10A is formed, the bonding film 3 is not sintered yet.

Then, this stack 10A is heated to thereby sinter the copper powder contained in the bonding film 3. Thus, the bonding layer 30 is formed via which the bonding target 5 and the copper foil 2 are bonded together. During the sintering, the atmosphere is preferably an inert gas atmosphere such as a nitrogen atmosphere. The sintering temperature is preferably less than 300° C., more preferably 150° C. or more and less than 300° C., even more preferably 200° C. or more and less than 300° C., and yet even more preferably 230° C. or more and less than 300° C. The sintering time is preferably 30 minutes or shorter, more preferably from 0.5 minutes to 25 minutes, and even more preferably from 1 minute to 20 minutes, on condition that the sintering temperature is within the above-described range.

Preferably, the sintering is performed under pressure. In this case, the pressure that is applied is preferably 0.001 MPa or more, more preferably from 0.001 MPa to 20 MPa, and even more preferably from 0.01 MPa to 15 MPa.

The bonding layer 30 formed through the foregoing steps is a sintered structure of the copper powder contained in the bonding film 3. More specifically, the bonding layer 30 is made of a sintered body of the metal particles contained in the bonding film 3, and is formed by sintering the bonding film 3. In the case where the bonding film 3 contains the solid reducing agent represented by the chemical formula (1) or (2) above, a structure (3) below derived from copper in the copper powder and the solid reducing agent is formed in the bonding layer 30.

[Chem. 3]

(3)

In the formula, $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group. Regarding the details of $R^3$ to $R^5$, the description of those in the chemical formulae (1) and (2) above applies as appropriate. In the formula, * represents a copper-binding site.

Whether or not the structure (3) is formed in the bonding layer 30 can be checked by performing mass spectrometry (TOF-SIMS) or the like on a cross section of the bonding layer. For example, in the case where BIS-TRIS is used as the solid reducing agent, a fragment of molecular weight 152 attributed to C—N(Cu)$_2$ is observed in a TOF-SIMS mass spectrum on the cathode side.

It is preferable that the thickness of the bonding layer 30 is adjusted such that the bonding layer 30 reliably joins the copper foil and the bonding target to each other and also has sufficiently high electrical conductivity and heat conductivity. Specifically, the thickness of the bonding layer 30 is preferably 0.1 μm or more, and more preferably 1 μm or more. Also, the thickness of the bonding layer 30 is preferably 950 μm or less, and more preferably 500 μm or less. Note that, in the production process of the bonding layer 30, the liquid medium becomes no longer present in the bonding film 3, and thus, the thickness of the bonding layer 30 is equal to or smaller than the thickness of the bonding film 3.

The thickness of the bonding layer 30 can be controlled as appropriate by adjusting the thickness of a film that is formed using the above-described bonding layer composition, or the thickness of the bonding film 3. The thickness of the bonding layer 30 is measured by resin embedding and then polishing the bonding layer, and observing the polished surface under an electron microscope.

The above-described bonding material 1, and the bonded structure 10 having the above-described bonding layer 30, can be favorably used in environments exposed to high temperatures, for example, in an in-vehicle electronic circuit or an electronic circuit in which a power device is implemented, by taking advantage of their characteristics such as high bonding strength, electrical conductivity, and heat conductivity. In particular, the bonding material 1 is favorably used as a bonding base material for forming a wire bonding structure in a power device. An example of the wire bonding structure in which the bonded structure of the present invention can be favorably used is a form in which a plurality of bonded structures 10 are electrically connected to electrodes of a lead frame or the like via metal wires made of a metal such as gold, copper, or aluminum. One or more metal wires are arranged on the copper foil 2 of each bonded structure 10 and electrically connect the bonded structure 10 to the electrode(s).

EXAMPLES

Hereinafter, the present invention will be described in greater detail using examples. However, the scope of the present invention is not limited to examples below.

Example 1

(1) Preparation of Bonding Layer Composition 70 parts by mass of spherical copper particles (manufactured by Mitsui Mining & Smelting Co., Ltd.) with a $D_{SEM50}$ of 140 nm and 30 parts by mass of flat copper particles (manufactured by Mitsui Mining & Smelting Co., Ltd.) with a $D_{50}$ of 4.9 μm and an aspect ratio of 13.3 were used as the copper powder. BIS-TRIS (manufactured by Dojindo Laboratories) was used as the solid reducing agent. A mixture of hexylene glycol (HG) (manufactured by Mitsui Chemicals, Inc.) and Polyethylene glycol 300 (PEG300) (manufactured by NOF CORPORATION) was used as the liquid medium. These materials were mixed to obtain a paste-like bonding layer composition. The solid reducing agent content was 2.5 parts by mass with respect to 100 parts by mass of the copper powder. The liquid medium content was set such that the HG content was 28 parts by mass, and the PEG300 content was 1 part by mass, with respect to 100 parts by mass of the copper powder. Moreover, the bonding layer composition had a viscosity of 70 Pa·s at a shear rate of 10 $s^{-1}$ and 25° C.

(2) Production of Bonding Material

The bonding layer composition was applied through screen printing to the center of a rolled copper foil (thickness: 0.2 mm) having a square shape with sides of 20 mm and having been surface-treated with benzotriazole, to thereby form a coating film. The coating film was formed in a square shape with sides of 5.5 mm. At this time, the thickness of the coating film was 100 µm. This coating film were dried in a hot air drier under atmospheric pressure at 110° C. for 20 minutes to partially remove the liquid medium, and was then allowed to stand at room temperature. Thus, a bonding material was obtained in which a bonding film formed of the dried coating film was formed on one surface of the copper foil. The liquid medium content in the bonding film was confirmed to be 1.1 mass %. The thickness of the bonding film was 70 µm.

(3) Production of Bonded Structure

An alumina chip with a metal layer 5A made of silver being formed on a surface thereof through silver metallizing was used as a bonding target 5. The bonding material 1 was placed such that the metal layer 5A of the alumina chip (bonding target 5) and the bonding film 3 of the bonding material 1 faced each other, to obtain a stack 10A. Then, while a pressure of 9 MPa was applied to the stack 10A in the thickness direction thereof, the stack 10A was fired in a nitrogen atmosphere at 280° C. for 5 minutes. Thus, a bonded structure 10 in which the bonding target 5 and the copper foil 2 were bonded together via the bonding layer 30 was obtained. Mass spectrometry (TOF-SIMS) confirmed that the bonding layer 30 was formed of a sintered structure of the copper powder, and a structure derived from copper and the solid reducing agent, which is represented by the structure (3) above, was formed in the bonding layer 30. The thickness of the thus formed bonding layer 30 was 43 µm.

Figures 2A, 2B:
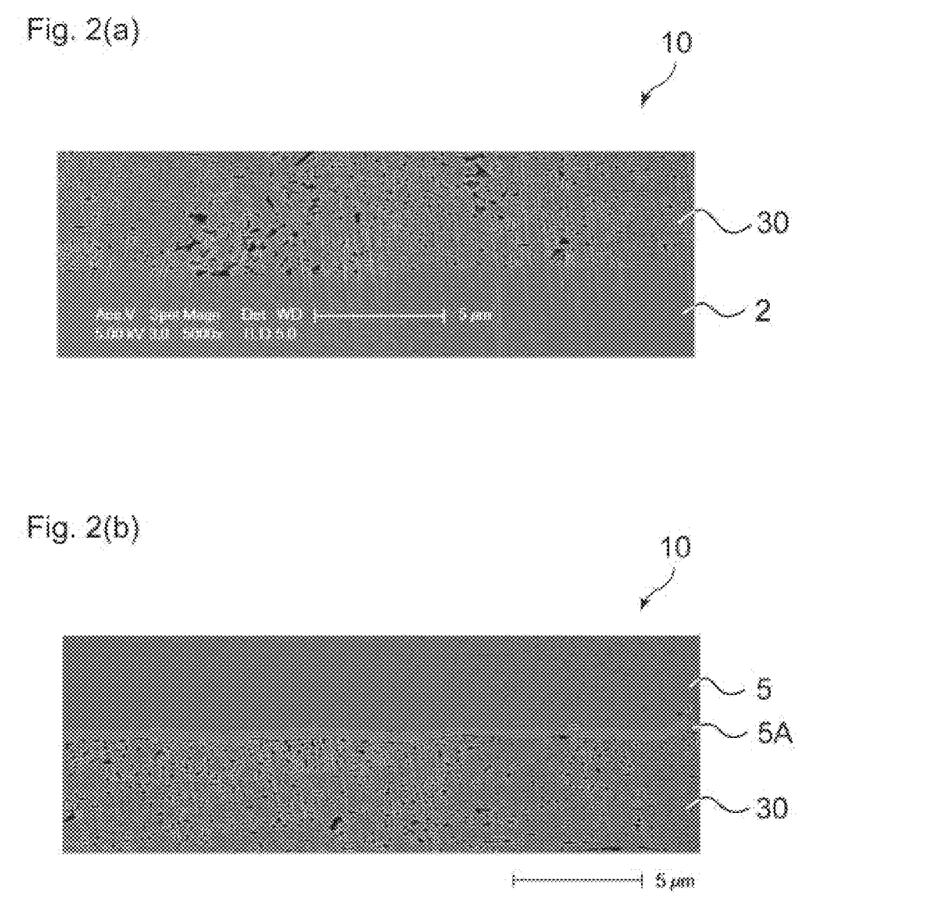
FIG. 2(a) is an electron microscope image of a copper foil and a bonding layer in a cross section of a bonded structure of Example 1 in a thickness direction thereof.
FIG. 2(b) is an electron microscope image of the bonding layer, a metal layer, and a bonding target in a cross section of the bonded structure of Example 1 in the thickness direction thereof.

Then, a cross section taken along the thickness direction of the bonded structure 10 produced in Example 1 was observed using a scanning electron microscope. FIG. 2(a) shows a magnified image of the copper foil 2 and the bonding layer 30, and FIG. 2(b) shows a magnified image of the silver-metallized alumina chip (metal layer 5A and bonding target 5) and the bonding layer 30.

As supported by the results of observation of the extent of bonding at an interface between the bonding layer 30 and the copper foil 2 shown in FIG. 2(a) as well as the extent of bonding at an interface between the bonding layer 30 and the metal layer 5A shown in FIG. 2(b), it can be seen that the bonding material of the example and the bonded structure using the bonding material realized high bonding strength between the copper foil 2 and the bonding target 5.

INDUSTRIAL APPLICABILITY

According to the present invention, a bonding material and a bonded structure that realize both high bonding strength and a reduced production cost are provided.

The invention claimed is:

1. A bonding material comprising:
   a copper foil, a thickness of the copper foil being in a range of 0.5 µm to 200 µm; and
   a sinterable bonding film formed on only one surface of the copper foil,
   wherein the bonding film contains a metal powder and a solid reducing agent,
   the bonding film contains, as the metal powder, only an assemblage of copper particles made only of copper and a balance consisting of unavoidable impurities, and
   the bonding material is used for bonding to a bonding target having, on its surface, at least one metal selected from the group consisting of gold, silver, copper, nickel, and aluminum.

2. A bonding material that is used to form a wire bonding structure, the bonding material comprising:
   a copper foil, a thickness of the copper foil being in a range of 0.5 µm to 200 µm; and
   a sinterable bonding film formed on only one surface of the copper foil,
   wherein the bonding film contains metal powder and a solid reducing agent, and
   the bonding film contains, as the metal powder, only an assemblage of copper particles made only of copper and a balance consisting of unavoidable impurities.

3. The bonding material according to claim 1,
   wherein the bonding film contains the solid reducing agent in an amount of 0.1 parts by mass to 10 parts by mass with respect to 100 parts by mass of the metal powder.

4. The bonding material according to claim 1,
   wherein the copper particles contain spherical copper particles, and
   a volume-based cumulative particle size $D_{SEM50}$ at a cumulative volume of 50 vol % as measured using a scanning electron microscope of the spherical copper particles is from 30 nm to 200 nm.

5. The bonding material according to claim 1,
   wherein the solid reducing agent is an amino alcohol compound.

6. A bonded structure in which a bonding target having, on its surface, at least one metal selected from the group consisting of gold, silver, copper, nickel, and aluminum and a copper foil are electrically connected to each other via a bonding layer formed of a sintered structure of powder a bonding film,
   wherein a thickness of the copper foil is in a range of 0.5 µm to 200 µm,
   the bonding film contains a metal powder and a solid reducing agent and is formed on only one surface of the copper foil,
   the bonding film contains, as the metal powder, only an assemblage of copper particles made only of copper and a balance consisting of unavoidable impurities, and
   a structure (3) below is formed in the bonding layer:

where $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group, and * represents a copper-binding site.

7. The bonded structure according to claim 6,
wherein the bonding layer has a thickness of 0.1 μm to 950 μm.

8. The bonding material according to claim 1,
wherein the bonding film becomes a bonding layer after the bonding film is sintered, and
the bonding layer contains a structure derived from the metal powder and the solid reducing agent.

9. The bonding material according to claim 2,
wherein the bonding film becomes a bonding layer after the bonding film is sintered, and
the bonding layer contains a structure derived from the metal powder and the solid reducing agent.

10. The bonding material according to claim 1,
wherein the copper particles are present in the bonding film as an unfused state.

11. The bonding material according to claim 2,
wherein the copper particles are present in the bonding film as an unfused state.

12. The bonded structure according to claim 6,
wherein the copper particles are present in the bonding film as an unfused state.

* * * * *